US008975603B2

(12) United States Patent
Qin et al.

(10) Patent No.: US 8,975,603 B2
(45) Date of Patent: Mar. 10, 2015

(54) SYSTEMS AND METHODS FOR PLASMA DOPING MICROFEATURE WORKPIECES (71) Applicant: Micron Technology, Inc., Boise, ID (US)

(72) Inventors: Shu Qin, Boise, ID (US); Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/171,430

(22) Filed: Feb. 3, 2014

(65) Prior Publication Data

US 2014/0144379 A1    May 29, 2014

Related U.S. Application Data (62) Division of application No. 11/217,882, filed on Sep. 1, 2005, now Pat. No. 8,642,135.

(51) Int. Cl.
G21K 5/04 (2006.01)
C23C 16/515 (2006.01)
C23C 14/48 (2006.01)
C23C 14/16 (2006.01)
H01L 21/223 (2006.01)
H01J 37/32 (2006.01)
C23C 16/517 (2006.01)
C23C 16/28 (2006.01)

(52) U.S. Cl.
CPC .............. C23C 14/48 (2013.01); C23C 16/515 (2013.01); C23C 14/16 (2013.01); H01L 21/2236 (2013.01); H01J 37/32412 (2013.01); C23C 16/517 (2013.01); C23C 16/28 (2013.01); Y10S 438/914 (2013.01)

USPC ................. 250/492.3; 250/492.1; 250/492.2; 427/524; 427/523; 427/530; 427/531; 427/569; 427/576; 438/513; 438/514; 438/515; 438/194; 438/798; 438/914

(58) Field of Classification Search
USPC ................. 250/492.1, 492.2, 492.21, 492.22, 250/492.23, 492.3; 427/524, 523, 530, 531, 427/569, 576; 438/513, 514, 515, 194, 798, 438/914
See application file for complete search history.

(56) References Cited

U.S. PATENT DOCUMENTS

| 4,937,205 | A | 6/1990 | Nakayama et al. |
| 5,015,493 | A | 5/1991 | Gruen |
| 5,458,927 | A | 10/1995 | Malaczynski et al. |
| 5,476,691 | A | 12/1995 | Komvopoulos et al. |
| 5,508,227 | A | 4/1996 | Chan et al. |
| 5,558,718 | A | 9/1996 | Leung |
| 5,654,043 | A | 8/1997 | Shao et al. |
| 5,672,541 | A | 9/1997 | Booske et al. |
| 5,883,016 | A | 3/1999 | Chan et al. |
| 5,911,832 | A | 6/1999 | Denholm et al. |
| 6,101,971 | A | 8/2000 | Denholm et al. |
| 6,187,685 | B1 | 2/2001 | Hopkins et al. |
| 6,237,527 | B1 | 5/2001 | Kellerman et al. |
| 6,475,906 | B1 | 11/2002 | Lee |

(Continued)

Primary Examiner — Nicole Ippolito
(74) Attorney, Agent, or Firm — Perkins Coie LLP (57) ABSTRACT Systems and methods for plasma doping microfeature workpieces are disclosed herein. In one embodiment, a method of implanting boron ions into a region of a workpiece includes generating a plasma in a chamber, selectively applying a pulsed electrical potential to the workpiece with a duty cycle of between approximately 20 percent and approximately 50 percent, and implanting an ion specie into the region of the workpiece.

18 Claims, 4 Drawing Sheets

(56) References Cited

U.S. PATENT DOCUMENTS

| | | |
|---|---|---|
| 6,504,159 B1 | 1/2003 | Keller |
| 6,527,918 B2 | 3/2003 | Goeckner et al. |
| 6,544,406 B1 | 4/2003 | Warren et al. |
| 6,632,482 B1 | 10/2003 | Sheng |
| 6,863,018 B2 | 3/2005 | Koizumi et al. |
| 6,893,907 B2 | 5/2005 | Maydan et al. |
| 8,119,208 B2 | 2/2012 | Chu et al. |
| 8,216,922 B2 | 7/2012 | Hayashi et al. |
| 8,262,869 B2 | 9/2012 | Kouznetsov |
| 8,278,196 B2 | 10/2012 | Huang et al. |
| 2001/0046566 A1 | 11/2001 | Chu et al. |
| 2004/0166612 A1 | 8/2004 | Maydan et al. |
| 2005/0191830 A1 | 9/2005 | Collins et al. |
| 2006/0081558 A1 | 4/2006 | Collins et al. |
| 2006/0097193 A1 | 5/2006 | Horsky et al. |
| 2006/0124245 A1* | 6/2006 | Kikuchi et al. .......... 156/345.49 |
| 2007/0048453 A1 | 3/2007 | Qin et al. |
| 2008/0026133 A1* | 1/2008 | Fang et al. ................ 427/8 |
| 2009/0104719 A1 | 4/2009 | Gupta et al. |

\* cited by examiner

| QUANTILES | | | | | | | |
|---|---|---|---|---|---|---|---|
| LEVEL | MINIMUM | 10% | 25% | MEDIAN | 75% | 90% | MAXIMUM |
| 1 | 2149.4 | 2171.81 | 2273.2 | 2375.1 | 2402.5 | 2450.1 | 2563.5 |
| 2 | 1074.1 | 1085.71 | 1165.95 | 1244.55 | 1360.1 | 1406.02 | 1465.6 |
| 3 | 1587.2 | 1648.59 | 1702.85 | 1765.2 | 1841.05 | 1901.04 | 1940.9 |
| 4 | 1089.4 | 1119.84 | 1197 | 1216.7 | 1246.7 | 1258.28 | 1279.2 |
| 5 | 1216 | 1293.3 | 1373.825 | 1408.7 | 1460.05 | 1516.08 | 1597.3 |
| 6 | 1550.8 | 1578.16 | 1685.05 | 1736.05 | 1766.775 | 1830.31 | 1843.9 |
| 7 | 1721.3 | 1754.42 | 1778.5 | 1829.6 | 1893.6 | 1957.04 | 1982.6 |

SYSTEMS AND METHODS FOR PLASMA DOPING MICROFEATURE WORKPIECES

CROSS-REFERENCE TO RELATED APPLICATION

This application is a divisional of U.S. application Ser. No. 11/217,882 filed Sep. 1, 2005, now U.S. Pat. No. 8,642,135, which is incorporated herein by reference.

TECHNICAL FIELD

The present invention is directed to systems and methods for plasma doping microfeature workpieces.

BACKGROUND

Semiconductor devices and other microelectronic devices are typically manufactured on a wafer having a large number of individual dies (e.g., chips). Each wafer undergoes several different procedures to construct the switches, capacitors, conductive interconnects, and other components of the devices. For example, a wafer can be processed using lithography, etching, deposition, planarization, annealing, and other procedures that are repeated to construct a high density of features. One additional aspect of manufacturing microelectronic devices includes forming numerous doped regions on the wafer where specific types of atoms have been implanted to impart the desired electrical properties to the wafer. To reduce the size of the features on the wafer, the ions are typically implanted in shallow regions of the wafer and define shallow junctions.

Figure 1:
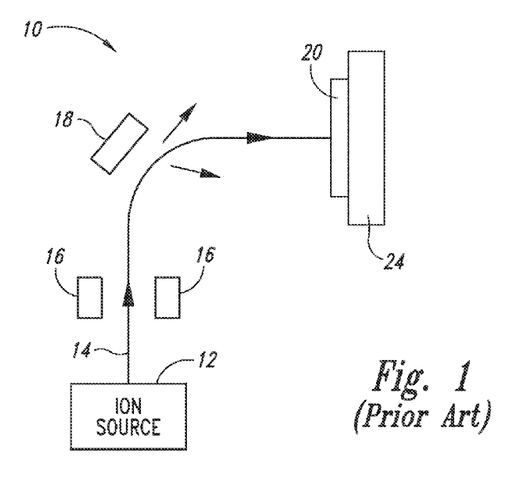
FIG. 1 schematically illustrates a conventional ion beam implantor for forming doped regions in a wafer.

FIG. 1 schematically illustrates a conventional ion beam implantor 10 for forming doped regions in a wafer 20. The ion beam implantor 10 includes an ion source 12 (shown schematically) for generating an ion beam 14, an accelerator 16 for accelerating the ions to a high enough velocity such that they have sufficient momentum to penetrate the surface of the wafer 20, a separator 18 for bending the ion beam 14 to separate undesired ions, and a wafer chuck 24 for holding the wafer 20. The ion beam 14 is typically a low energy beam for shallow junction implantation.

One drawback of the conventional ion beam implantor 10 is that the ion beam 14 impinges on only a small section of the wafer 20 at any given time and accordingly must be scanned across the wafer 20 to form the doped regions in the wafer 20. This process is relatively slow and, consequently, results in a relatively low throughput. Another drawback of the conventional ion beam implantor 10 is that the ion beam current is split by repelling positively charged ions. This causes significant losses during beam transportation to the wafer 20. Moreover, in low energy implant on ultra-shallow junction applications, the losses are even greater. Thus, a small fraction of the ion beam 14 reaches the wafer 20, which results in a low implantation rate and reduced throughput. Another drawback of the conventional ion beam implantor 10 is that the ion beam 14 causes sputtering on the wafer 20. Sputtering can cause retained dose saturation of the dopant and in turn sheet resistance saturation in the wafer 20. Yet another drawback of the conventional ion beam implantor 10 is that it is difficult to dope non-planar structures on the wafer 20. Accordingly, there is a need to improve the process of doping semiconductor wafers.

BRIEF DESCRIPTION OF THE DRAWINGS

FIGS. 3-6 are examples of data collected from several different plasma doping processes conducted in accordance with embodiments of the invention.

FIG. 4 is a graph illustrating implant doses and deposition thicknesses versus pulse widths and implant times.

FIG. 5 is a graph illustrating implant doses and sheet resistances versus pulse widths and implant times.

FIG. 6 illustrates the improved electrical performance of wafers doped using plasma processes relative to wafers doped with conventional ion beam implantors.

DETAILED DESCRIPTION

A. Overview

The following disclosure describes various embodiments of systems and methods for plasma doping microfeature workpieces. One aspect of the invention is directed to methods of implanting boron ions into regions of microfeature workpieces. In one embodiment, a method includes generating a plasma in a chamber, selectively applying a pulsed electrical potential to the workpiece with a duty cycle of between approximately 20 percent and approximately 50 percent, and implanting an ion specie into the region of the workpiece. For example, the plasma can be a pulsed or continuous plasma. The electrical potential applied to the workpiece can be between approximately 250 eV and 20 keV. The method may further include flowing $B_2H_6/H_2$ and/or $B_2H_6/He$ into the chamber.

Another aspect of the invention is directed to methods of forming doped regions in microfeature workpieces. In one embodiment, a method includes generating a plasma in a chamber, selectively applying a series of negative voltage pulses to the workpiece, and implanting a dopant ion specie into the workpiece with a total implant time. The workpiece is biased with the negative voltage pulses for at least 20 percent of the total implant time, which can be 62 seconds or less. The dopant ion specie can include boron ions or other suitable dopants.

Another aspect of the invention is directed to systems for implanting boron ions into regions of microfeature workpieces. In one embodiment, a system includes a plasma chamber, a workpiece support positioned in the plasma chamber and configured to carry the workpiece, an energy source positioned to generate a plasma within the plasma chamber, a power source operably coupled to the workpiece support for applying a pulsed electrical potential to the workpiece, and a controller operably coupled to the power source. The controller has a computer-readable medium containing instructions to perform any one of the above-mentioned methods.

Specific details of several embodiments of the invention are described below with reference to plasma systems for forming doped regions in microfeature workpieces. Several details describing well-known structures or processes often associated with plasma systems and/or methods of doping workpieces are not set forth in the following description for purposes of clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 2-6.

The term "microfeature workpiece" is used throughout to include substrates upon which and/or in which microelectronic devices, micromechanical devices, data storage elements, optics, and other features are fabricated. For example, microfeature workpieces can be semiconductor wafers, glass substrates, dielectric substrates, or many other types of substrates. Many features on such microfeature workpieces have critical dimensions less than or equal to 1 µm, and in many applications the critical dimensions of the smaller features are less than 0.25 µm or even less than 0.1 µm. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

Figure 2:
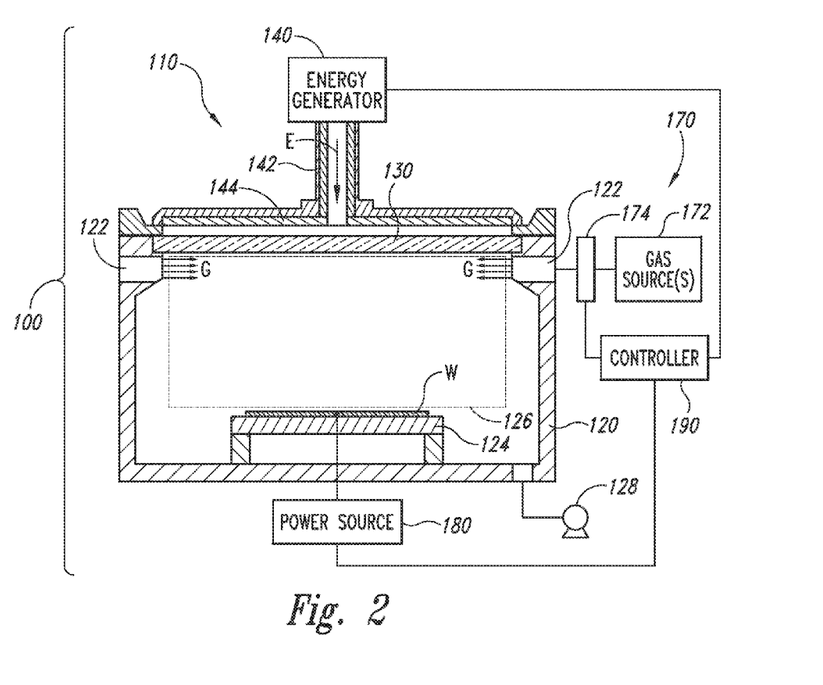
FIG. 2 is a schematic cross-sectional view of a plasma doping system for processing a microfeature workpiece in accordance with one embodiment of the invention.

B. Embodiments of Plasma Systems for Forming Doped Regions in Microfeature Workpieces FIG. 2 is a schematic cross-sectional view of a plasma doping system 100 for processing a microfeature workpiece W in accordance with one embodiment of the invention. The illustrated plasma doping system 100 includes a reactor 110, a gas supply 170 for providing gases to the reactor 110, a power source 180 (shown schematically) for selectively applying a pulsed electrical potential to the workpiece W, and a controller 190 (shown schematically) containing computer operable instructions for controlling the processing of the workpiece W in the reactor 110. The plasma doping system 100 can simultaneously form a plurality of doped regions across the workpiece W, including shallow junctions, while minimizing deposition on the workpiece W as described below.

The illustrated reactor 110 includes a chamber 120, a gas distributor 122 in fluid communication with the gas supply 170, a workpiece support 124 for carrying the workpiece W in the chamber 120, and a window 130 transmissive to plasma energy. The gas distributor 122 can be an annular antechamber having a plurality of ports for injecting or flowing gas(es) G into the chamber 120. The gas is evacuated from the chamber 120 with a vacuum pump 128 or other suitable device. The window 130 can be a plate or pane of material through which energy propagates into the chamber 120 to generate a plasma in a plasma zone 126. The window 130 accordingly has a high transmissivity to the plasma energy that generates the plasma. For example, when microwave energy is used to generate the plasma, the window 130 can be a quartz plate or other material that readily transmits microwaves.

The reactor 110 further includes an energy system having a generator 140 (shown schematically) for generating a plasma energy, an energy guide 142 coupled to the generator 140, and an antenna 144 or other type of transmitter coupled to the energy guide 142. The generator 140 can include a power supply (e.g., DC, pulsed DC, or RF) to generate microwave, radio-frequency, or other suitable types of radiation at a frequency selected for producing a plasma in the plasma zone 126. Specifically, the generator 140 generates a plasma energy E that propagates through the energy guide 142 to the antenna 144, and the antenna 144 transmits the plasma energy E through the window 130 to the plasma zone 126. The plasma can be a continuous plasma or a pulsed plasma. In other embodiments, however, the reactor may not include the energy system. For example, in one embodiment, the power source 180 can include a pulsed DC power source that applies a pulsed electrical potential to the workpiece W, which acts to solely generate the plasma and provide the energy necessary to implant the ion species. In such an embodiment, the reactor 110 may not include the generator 140, the energy guide 142, and the antenna 144 because the potential applied to the workpiece W generates the plasma.

The gas supply 170 includes one or more gas sources 172 for containing or producing process gases and a valve assembly 174 for regulating the flow of gas to the chamber 120. For example, in several applications, the gas sources 172 include a dopant gas source, a carrier gas source, and a purge gas source. The dopant gas can be $B_2H_6$ (Diborane) or other suitable gases, and the carrier gas can be $H_2$, $H_3$, or other suitable gases. The dopant and carrier gases can be mixed in the chamber 120 or before the gases flow into the chamber 120.

The controller 190 is operably coupled to the energy generator 140, the valve assembly 174, and the power source 180 to control the processing parameters. Specifically, the controller 190 provides signals to (a) the valve assembly 174 for flowing gas into the chamber 120, and (b) the energy generator 140 for generating a plasma from the gas in the plasma zone 126. The controller 190 also provides signals to the power source 180 for applying a pulsed negative electrical potential to the workpiece W. For example, the power source 180 can apply a pulsed negative potential of between 250 eV and 20 keV, such as between 0.5 keV and 10 keV, to the workpiece W. The pulsed negative electrical potential draws positive ions from the plasma zone 126 toward the workpiece W. Ions with sufficient momentum are implanted into the workpiece W and form doped regions. For example, in applications in which $B_2H_6$ is the dopant gas, $B^+$, $B_2^+$, $B_2H_5^+$ and $H^+$ ions are implanted in the workpiece W. The hydrogen ions typically diffuse out of the workpiece W during subsequent annealing and leave the boron ions implanted in the doped regions. Although ions with sufficient momentum are implanted into the workpiece W, other positive ions are drawn to the workpiece W and accumulate on the dielectric layer at the surface of the workpiece W. The accumulation of positive ions at the surface of the workpiece W can damage the dielectric layer and cause arcing between the positive ions at the surface and the conductive features in the workpiece W.

In addition to ion implantation, deposition and etching (e.g., sputtering and reactive ion etching) also occur during plasma doping processes. For example, in applications in which $B_2H_6$ is the dopant gas, non-volatile $B_2H_5^*$, $B_2H_4^*$, $BH_3^*$, $BH_2^*$, $BH^*$, and $B^*$ radicals and clusters of radicals form in the plasma as atoms and/or molecules collide and attach with each other. These species are non-volatile and deposit onto the workpiece surface and the chamber wall surfaces. Deposition of these species affects the structure of the devices in the workpiece and the implanted dopant profile. For example, deposition can cause retained dose saturation of the dopant and in turn sheet resistance saturation in the workpiece. Moreover, the deposited layer on the surface of the workpiece inhibits ions from passing into the workpiece. As a result, the time required to implant a specific dose of a dopant into the workpiece is increased and throughput is reduced. Furthermore, the system must be shut down periodically to remove deposited material from the walls of the chamber, which also reduces throughput and increases the operating expenses.

Sputtering and reactive ion etching occur during plasma doping due to the momentum of the ions impinging on the workpiece and the chemical reactions at the workpiece, respectively. Specifically, the H* radicals react with the silicon workpiece and/or the deposited boron to form $SiH_4$ and/or $B_2H_6$, which are volatile and can be removed from the chamber. The net effect of the deposition and etching depends on the ion implantation because ion bombardment affects the rate of etching. As such, etching is dominant when the workpiece W is electrically biased and ions are implanted into the workpiece. Conversely, deposition is dominant when the workpiece is not electrically biased.

The general knowledge of the art before the present invention understood that applying a pulsed electrical potential with a relatively short pulse width during plasma processing was desirable for several reasons. First, a pulsed electrical potential with a relatively short pulse width reduces the accumulation of positive ions at the surface of the workpiece. The accumulation of positive ions at the surface of the workpiece may damage the dielectric layer and cause arcing between the positive ions and the conductive features in the workpiece. Second, a pulsed electrical potential with a relatively short pulse width does not heat the workpiece to an excessive temperature, which may exceed the thermal budget of the workpiece. As a result, conventional plasma processes applied a pulsed electrical potential with a pulse width of less than 30 microseconds.

The present inventors, however, have discovered that in plasma doping the pulse width can be increased to mitigate deposition on the workpiece without causing significant damage to the dielectric layer at the surface of the workpiece. Specifically, in several applications in which the frequency is 5 kHz, the pulse width is greater than 35 microseconds. For example, the pulse width can be between 35 and 200 microseconds, such as between 35 and 70 microseconds, between 40 and 60 microseconds, and/or between 60 and 120 microseconds. At other frequencies, the pulse width can be different. In any case, the lengthened pulse width increases the duty cycle of the plasma doping process and reduces deposition on the workpiece because the portion of the total implant time during which deposition dominates the process is reduced and the portion of the total implant time during which etching dominates the process is increased. For example, in several embodiments, the duty cycle can be greater than 20%, such as between 20% and 50%, between 30% and 50%, or between 40% and 50%.

One advantage of reducing the deposition on the workpieces during plasma doping processes is that the resulting workpieces have reduced sheet resistance and/or other improved electrical properties. Another advantage is that the thin deposition layer inhibits fewer ions from passing into the workpiece during ion implantation. This reduces the total time required to implant a specific dose of a dopant into the workpiece and increases the throughput of the system. Yet another advantage of reducing deposition is that the plasma doping system must be shut down less frequently to remove deposited material from the walls of the chamber, which reduces the operating expenses and increases the throughput of the system.

Another feature of the plasma doping system 100 illustrated in FIG. 2 is that the plasma zone 126 extends across the entire workpiece W. An advantage of this feature is that the system 100 can simultaneously form numerous doped regions on the workpiece W, which reduces the processing time required to form the doped regions and increases the throughput of the system 100. Another advantage of the plasma doping system 100 illustrated in FIG. 2 is that the system 100 is relatively simple and inexpensive compared to conventional ion beam implantors, such as the implantor 10 illustrated in FIG. 1.

D. Several Examples of Data Collected From Different Plasma Doping Processes

Figure 3A:
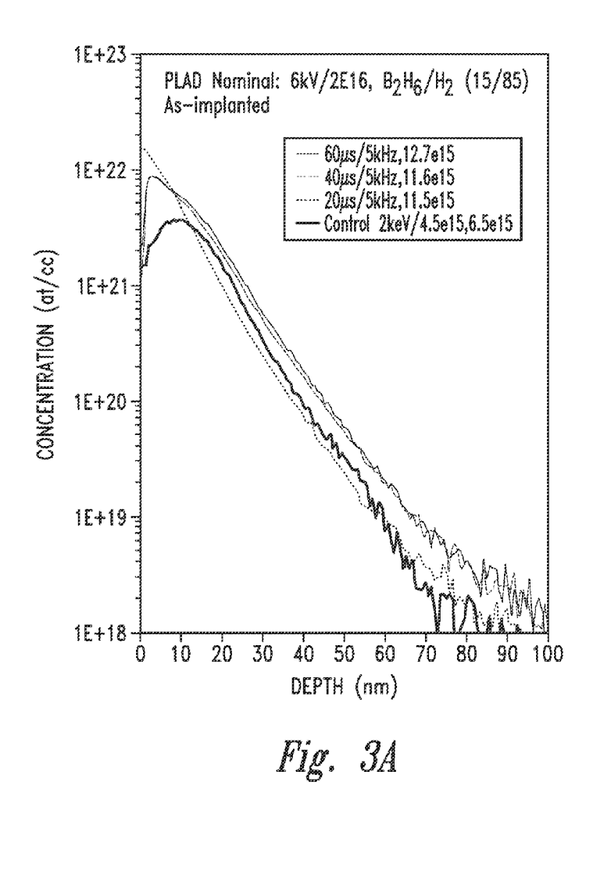
FIG. 3A is a graph illustrating the concentration of boron at specific depths in four wafers after plasma doping the wafers.
Figure 3B:
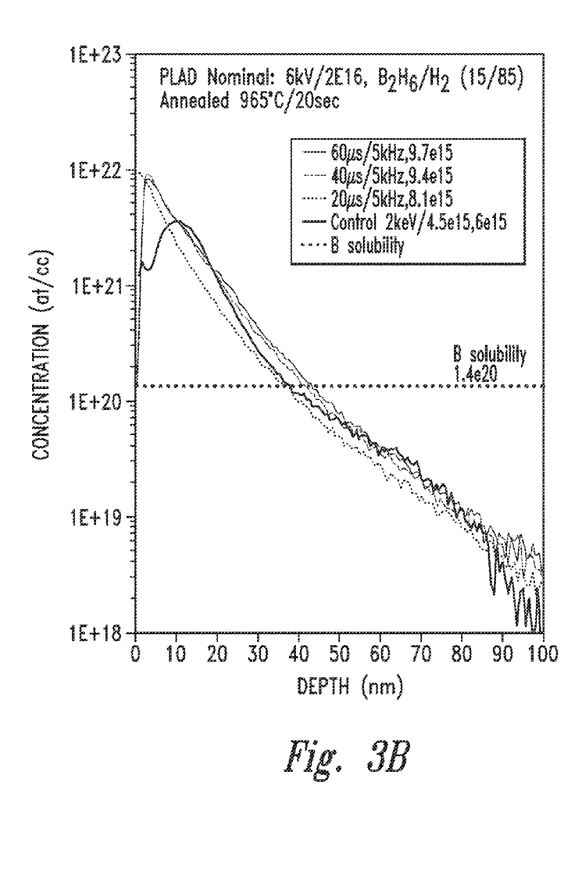
FIG. 3B is a graph illustrating the concentration of boron at specific depths in the four wafers after annealing.
Figure 4:
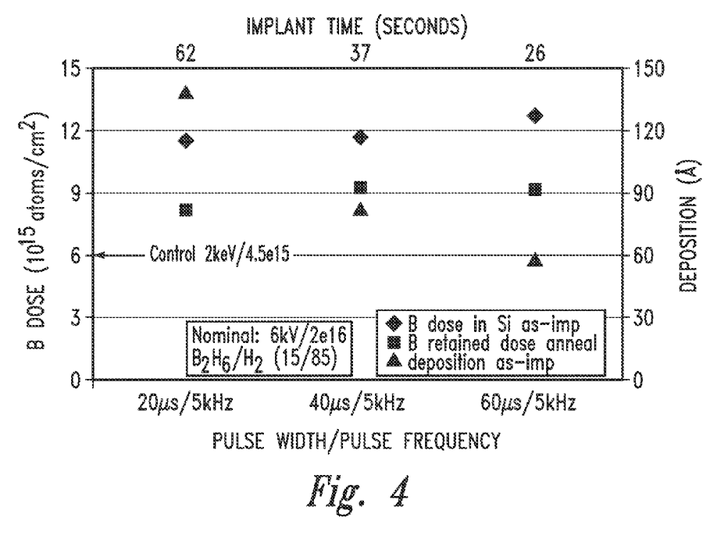
Figure 5:
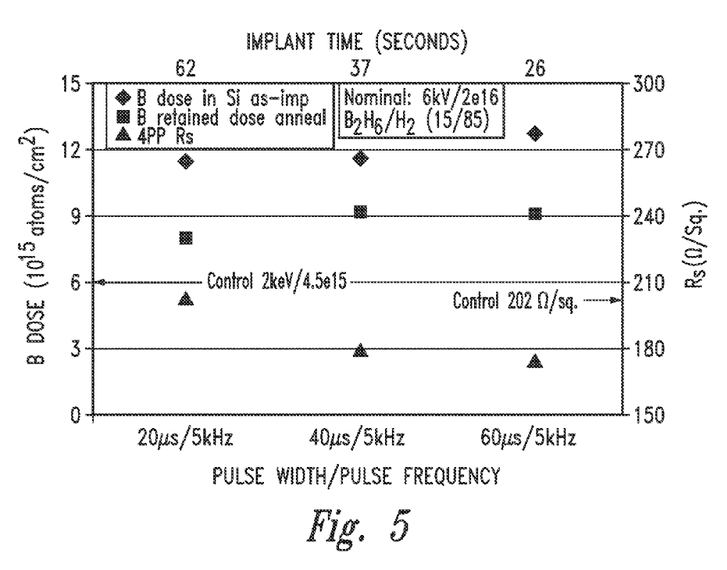

FIGS. 3-6 are examples of data collected from several different plasma doping processes conducted in accordance with embodiments of the invention. For example, FIGS. 3-5 illustrate the data gathered during several plasma doping processes conducted with the process parameters listed below in Table 1:

TABLE 1

Structure: single crystalline Si n-type blanket wafers

RF Power: 725 W
$B_2H_6/H_2$ gas ratio: 15/85
Nominal PLAD conditions: voltage −6 kV & dose 2e16
Pressure/gas flow rate: 6 mTorr/120 sccm
Pulse width/frequency: 0, 20, 40, and 60 μsec/5 kHz (Duty cycle: 0, 10%, 20%, and 30%)
Anneal conditions: strip/SC1 clean/RTP 965° C./20 sec The deposition was measured by an Ellipsometry technique before strip/clean. The boron doses (implanted and annealed) were measured by a SIMS technique after strip/clean. The sheet resistance was measured by a four point probe technique after strip/clean.

FIG. 3A is a graph illustrating the concentration of boron at specific depths in four wafers after plasma doping the wafers. Three of the wafers were plasma doped using a pulsed electrical potential with pulse widths of 20, 40, and 60 microseconds, respectively. The fourth wafer was doped using conventional ion beam implantation. FIG. 3B is a graph illustrating the concentration of boron at specific depths in the four wafers after annealing. As illustrated in FIGS. 3A and 3B, the two plasma-doped wafers that were doped with the longer pulse widths (i.e., 40 and 60 microseconds) have generally similar profiles and concentrations. Moreover, these two wafers have a greater concentration or at least generally the same concentration of boron between a depth of 0 nm and 100 nm as the wafer that was plasma-doped with the shorter pulse width (i.e., 20 microseconds) and the wafer that was doped using conventional ion implantation, with the exception that the wafer which was plasma doped with the shorter pulse width has a slightly greater concentration of boron near the surface.

FIG. 4 is a graph illustrating plasma implant doses and deposition thicknesses versus pulse widths and implant times. The plasma doping processes with longer electrical pulse widths have quicker implant times for a given dose because the pulse duty cycles are increased. For example, in the illustrated graph, the doping process with the pulse width of 20 microseconds has a duty cycle of 10% and a total implant time of 62 seconds; the doping process with the pulse width of 40 microseconds has a duty cycle of 20% and a total implant time of 37 seconds; and the doping process with the pulse width of 60 microseconds has a duty cycle of 30% and a total implant time of 26 seconds. The shorter implant times and increased duty cycles reduce the thickness of the deposition layer on the wafers. For example, in the illustrated graph, the doping process with the pulse width of 20 microseconds produced a deposition layer with approximately a 137 Å thickness; the doping process with the pulse width of 40 microseconds produced a deposition layer with approximately a 82 Å thickness; and the doping process with the pulse width of 60 microseconds produced a deposition layer with approximately a 57 Å thickness. Moreover, the retained doses of boron in all three plasma-doped wafers are greater than the retained dose of boron in the conventional ion-beam-doped wafer, which is labeled "control" in the graph. The layers can be 137 Å or less in thickness.

FIG. 5 is a graph illustrating plasma implant doses and sheet resistances ($R_s$) versus pulse widths and implant times. As illustrated in the graph, the plasma doping processes with longer electrical pulse widths (i.e., 40 and 60 microseconds) produce significantly less sheet resistance on the wafers than the conventional ion beam process, which is labeled "control" in the graph. The slightly lower sheet resistance of the wafer processed with the 60 microsecond pulse relative to the wafer processed with the 40-microsecond pulse is believed to be caused by the higher activation fraction for deeper boron ions during annealing due to less deposition.

Figure 6:
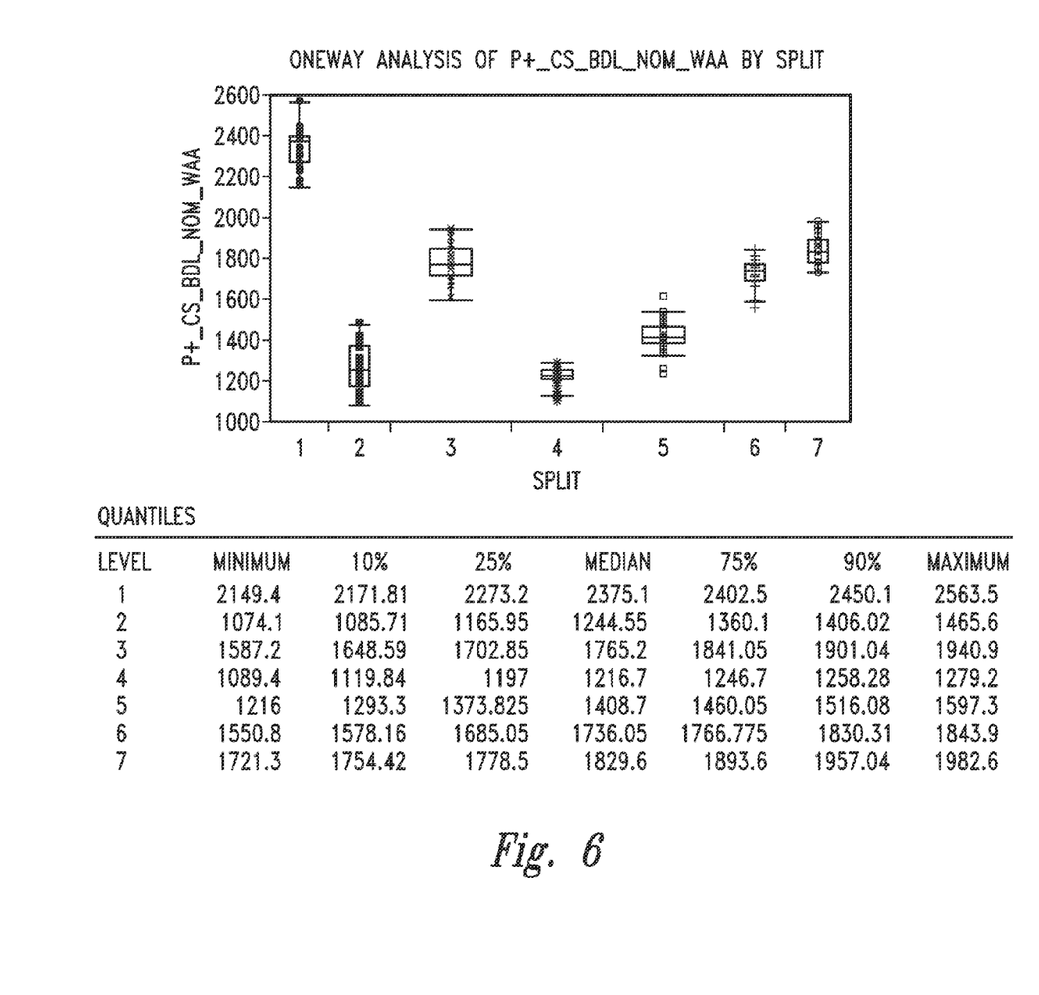

FIG. 6 and Table 2 below illustrate the improved electrical performance of wafers doped using plasma processes relative to wafers doped with conventional ion beam implantation. Table 2 lists the processing parameters of each split illustrated in FIG. 6.

TABLE 2

| Split | Energy | Dose | Pulse Frequency | Pulse Width | Dilution | Wafer List |
|---|---|---|---|---|---|---|
| 1C | 2 kV | 4.50E+15 | NA | NA | NA | 8, 10, 22 |
| 2E | 6 kV | 2.00E+16 | 5 kHz | 35 μs | 15/85 | 7, 12, 23, 24 |
| 3E | 6 kV | 1.50E+16 | 5 kHz | 35 μs | 15/85 | 2, 4, 9, 24 |
| 4E | 6 kV | 2.00E+16 | 5 kHz | 60 μs | 15/85 | 3, 6, 16, 21 |
| 5E | 5 kV | 2.00E+16 | 5 kHz | 70 μs | 15/85 | 5, 11, 15, 19 |
| 6E | 5 kV | 1.50E+16 | 5 kHz | 70 μs | 15/85 | 1, 17, 25 |
| 7E | 6 kV | 2.00E+16 | 5 kHz | 60 μs | 7.5/92.5 | 13, 18, 20 |

In FIG. 6, split 1 represents data collected from wafers processed in accordance with conventional ion beam implantation, and splits 2-7 represent data collected from wafers processed in accordance with plasma doping processes. All the plasma-doped wafers have lower contact resistance than the conventional ion-beam-implanted wafers. Moreover, in the illustrated example as evidenced by the difference in splits 2 and 4, the wafers that were plasma doped with a shorter pulse width (i.e., 35 microseconds) have a generally higher and wider range of contact resistance than the wafers that were plasma doped with a longer pulse width (i.e., 60 microseconds).

From the foregoing, it will be appreciated that specific embodiments of the invention have been described herein for purposes of illustration, but that various modifications may be made without deviating from the spirit and scope of the invention. For example, although the illustrated examples describe the implantation of boron in microfeature workpieces, the system can be used to implant other dopants. Additionally, other plasma reactors with different gas delivery systems and different energy sources can be used. One example of a different plasma reactor has an overhead gas distributor (e.g., a "showerhead") with an electrically biased distributor plate directly above the workpiece. Accordingly, the invention is not limited except as by the appended claims.

We claim:

1. A system for implanting boron ions into a region of a semiconductor workpiece, the system comprising:
   a plasma chamber;
   an RF source configured to generate a continuous plasma in the plasma chamber;
   a workpiece support positioned in the plasma chamber and configured to carry the semiconductor workpiece;
   a power source operably coupled to the workpiece support for applying a pulsed electrical potential to the semiconductor workpiece; and
   a controller operably coupled to the power source and to the RF source, the controller having a computer-readable medium containing instructions to perform a method comprising
      generating the continuous plasma in the plasma chamber;
      selectively applying a period of the pulsed electrical potential comprising a series of electrically biased DC pulses alternating with electrically unbiased gaps between the pulses to the semiconductor workpiece, wherein the pulses have a duty cycle of between approximately 10 percent and approximately below 50 percent;
      implanting at least a boron ion specie from a dopant gas in the chamber into the semiconductor workpiece;
      depositing at least the boron specie into the semiconductor workpiece during the gaps between the pulses; and
      etching a portion of the deposited boron specie from the semiconductor workpiece during the pulses.

2. The system of claim 1 wherein the computer-readable medium instruction for selectively applying the period of pulsed electrical potential comprises biasing the semiconductor workpiece with a pulsed electrical potential having a duty cycle of between approximately 30 percent and approximately below 50 percent.

3. The system of claim 1 wherein the computer-readable medium instruction for selectively applying the pulsed electrical potential comprises biasing the semiconductor workpiece with a pulsed electrical potential having a duty cycle of between approximately 40 percent and approximately 50 percent.

4. The system of claim 1 wherein the computer-readable medium further contains instructions to flow at least one of $B_2H_6/H_2$ and $B_2H_6/He$ into the plasma chamber.

5. The system of claim 1 wherein the computer-readable medium instruction for implanting an ion specie into the semiconductor workpiece comprises introducing the ion specie into the workpiece with a total implant time of 62 seconds or less.

6. The system of claim 1 wherein the computer-readable medium instruction for implanting an ion specie into the semiconductor workpiece comprises introducing the ion specie into the workpiece with a total implant time of 37 seconds or less.

7. The system of claim 1 wherein the computer-readable medium instruction for implanting an ion specie into the semiconductor workpiece comprises forming a doped region in the semiconductor workpiece.

8. The system of claim 1 wherein the computer-readable medium instruction for implanting an ion specie into the semiconductor workpiece comprises forming a shallow junction in the workpiece.

9. The system of claim 1 wherein the computer-readable medium instruction for selectively applying the pulsed electrical potential to the semiconductor workpiece comprises biasing the semiconductor workpiece with a pulsed electrical potential of between approximately 250 eV and approximately 20 keV.

10. The system of claim 1 wherein the computer-readable medium instruction for generating the plasma in the plasma chamber comprises generating the plasma based on the electrical potential of the semiconductor workpiece.

11. A system for forming a doped region in a semiconductor workpiece, the system comprising:
a plasma chamber;
a workpiece support positioned in the plasma chamber and configured to carry the semiconductor workpiece;
RF energy source positioned to impart energy to atoms within the plasma chamber to generate a continuous plasma in the plasma chamber;
a power source operably coupled to the workpiece support for applying a series of negative voltage pulses to the semiconductor workpiece; and
a controller operably coupled to the power source and to the RF source, the controller having a computer-readable medium containing instructions to perform a method comprising
generating the continuous plasma in the plasma chamber;
selectively applying the series of negative DC voltage pulses to the semiconductor workpiece, wherein the series of negative DC voltage pulses alternates with electrically unbiased gaps between the pulses; and
implanting a dopant ion specie into the semiconductor workpiece with a total implant time such that the workpiece is biased with the negative voltage pulses for at least 20 percent and less than about 50 percent of the total implant time.

12. The system of claim 11 wherein the computer-readable medium instruction for selectively applying the series of negative voltage pulses comprises biasing the semiconductor workpiece with the negative voltage pulses for between 30 percent and less than 50 percent of the total implant time.

13. The system of claim 11 wherein the computer-readable medium instruction for implanting the dopant ion specie into the semiconductor workpiece comprises introducing the dopant ion specie into the semiconductor workpiece with a total implant time of 62 seconds or less.

14. The system of claim 11 wherein the computer-readable medium instruction for implanting the dopant ion specie into the semiconductor workpiece comprises introducing boron ions into the doped region of the semiconductor workpiece.

15. A system fir implanting boron ions into a region of a semiconductor workpiece, the system comprising:
a plasma chamber;
means for supporting the semiconductor workpiece within the plasma chamber;
RF means for generating a continuous plasma within the plasma chamber;
means for applying a series of pulses of electrical potential to the semiconductor workpiece; and
a controller operably coupled to the means for applying the pulsed electrical potential and to the RF means for generating the continuous plasma, the controller having a computer-readable medium containing instructions to perform a method comprising
generating the continuous plasma in the plasma chamber;
selectively applying the pulsed electrical potential with electrically unbiased gaps between the pulses to the semiconductor workpiece, wherein the pulses have a duty cycle of at least approximately 20 percent and approximately below 50 percent; and
implanting boron ions into the semiconductor workpiece over a total implant time of 62 seconds or less.

16. The system of claim 15 wherein the computer-readable medium instruction for selectively applying the pulses of electrical potential to the semiconductor workpiece comprises biasing the semiconductor workpiece with a pulsed electrical potential having a duty cycle of between approximately 30 percent and approximately below 50 percent.

17. The system of claim 15 wherein the computer-readable medium instruction for selectively applying the pulsed electrical potential to the semiconductor workpiece comprises biasing the semiconductor workpiece with a pulsed electrical potential having a duty cycle of between approximately 40 percent and approximately below 50 percent.

18. The system of claim 15 wherein the computer-readable medium instruction for implanting boron ions into the semiconductor workpiece comprises introducing boron ions into the semiconductor workpiece with a total implant time of 37 seconds or less.

* * * * *